United States Patent [19]

Furukawa et al.

[11] Patent Number: 4,951,121
[45] Date of Patent: Aug. 21, 1990

[54] SEMICONDUCTOR DEVICE WITH A 3-PLY GATE ELECTRODE

[75] Inventors: Motoki Furukawa, Yokohama; Yoshihiro Kishita, Kawasaki; Tatsuro Mitani, Tokyo, all of Japan

[73] Assignee: Kabushiki Kaisha Toshiba, Kawasaki, Japan

[21] Appl. No.: 456,628

[22] Filed: Dec. 28, 1989

Related U.S. Application Data

[63] Continuation of Ser. No. 303,057, Jan. 27, 1989, which is a continuation of Ser. No. 191,772, May 2, 1988, which is a continuation of Ser. No. 797,496, Nov. 13, 1985, abandoned.

[30] Foreign Application Priority Data

Nov. 14, 1984 [JP] Japan ................... 59-238513

[51] Int. Cl.⁵ ............... H01L 23/48; H01L 29/80; H01L 29/48
[52] U.S. Cl. .................................. 357/71; 357/22; 357/15; 437/179
[58] Field of Search .............. 357/71, 22 J, 22 I, 357/15; 437/179, 192, 246

[56] References Cited

U.S. PATENT DOCUMENTS 4,546,540 10/1985 Ueyanagi et al. .............. 357/22 J
4,574,298 3/1986 Yamagishi et al. .............. 357/71
4,650,543 3/1987 Kishita et al. .............. 437/179

FOREIGN PATENT DOCUMENTS 0081999 6/1983 European Pat. Off. .
0106174 4/1984 European Pat. Off. .
0060568 5/1977 Japan ................... 437/246
0100480 8/1981 Japan ................... 357/22 S
57-153475 9/1982 Japan .
181676 10/1984 Japan .

OTHER PUBLICATIONS

Kohn, E. "High Temperature Stable Metal-GaAs Contacts" 1979 IEEE IEDM pp. 469–472.

Primary Examiner—Rolf Hille
Assistant Examiner—Robert P. Limanek
Attorney, Agent, or Firm—Finnegan, Henderson, Farabow, Garrett, and Dunner

[57] ABSTRACT

A semiconductor device comprising a compound semiconductor substrate whose surface is provided with a source region, a drain region and an interventing channel region; a source electrode formed on said source region; a drain electrode mounted on said drain region; and a 3-ply gate electrode formed on said channel region and consisting of a high melting metal layer, a barrier metal layer and a gold layer in that order.

5 Claims, 1 Drawing Sheet

SEMICONDUCTOR DEVICE WITH A 3-PLY GATE ELECTRODE

This application is a continuation, of application Ser. No. 07/303,057, filed Jan. 27, 1989 which is a continuation of Ser. No. 07/191,772 filed May 2, 1988 which is a continuation of Ser. No. 06/797,496 filed Nov. 13, 1985, now abandoned.

BACKGROUND OF THE INVENTION

I. Field of the Invention

This invention relates to a semiconductor device comprising a gate electrode of high melting metal provided in a self-alignment fashion, and, more particularly, to a super high frequency transistor and the method of manufacturing the same.

II. Description of the Prior Art

When a super high frequency semiconductor device is manufactured, mask alignment should be effected with a precision of ±1 micron in the formation of the various regions of a substrate and an electrode. However, the ordinary photoengraving process has the drawbacks that variations arise in the channel length and source resistance, which are parameters in defining the property of a semiconductor device, because mask alignment is carried out with low precision; the device itself presents variations in its property and has a low yield; and, moreover, the manufacture of said device involves complex processing.

For the resolution of the above-mentioned difficulties, the so-called self-alignment method has been proposed, this method comprising the steps of:

forming on a substrate a gate electrode prepared from such a high melting metal as can withstand the high temperature heat treatment required for the activation of an ion-implanted layer; and ion-implanting an impurity into the substrate using said gate electrode as a mask.

In the above-mentioned proposed method, the gate electrode is prepared from a high melting metal in place of, for example, a conventional low melting metal such as aluminium. Therefore, the proposed method offers the advantages that no difficulties arise even when a gate electrode is already formed at the time of the heat treatment required to activate an ion-implanted layer, said gate electrode being used in this case as a mask in ion implantation, thereby ensuring the precise formation of an impurity region.

However, the proposed self-alignment method is accompanied with the drawback that the high melting metal has a high resistance; thus imposing limitations on the improvement of the high frequency property of an super high frequency transistor and, in fact, disallowing the attainment of any appreciable improvement.

Apart from the proposed self-alignment method, attempts have also been made to deposit gold on the high-melting metal in order to reduce gate resistance. However, this attempt has also been accompanied with difficulties, such that, when annealing was carried out in a furnace for the activation of an ion-implanted layer, the gold penetrated the high melting metal and reacted with the substrate, thus destroying the Shottky contact. Therefore, only a high melting metal having high electric resistance must be used as a gate electrode. As a result, it is difficult to provide an super high frequency transistor.

SUMMARY OF THE INVENTION

It is, accordingly, an object of this invention to provide a semiconductor device which is free of the drawbacks accompanying any conventional device, and which has so low a noise level as to be suitably applied in super high frequency uses.

Another object of the invention is to provide a method of manufacturing the above-mentioned semiconductor device.

To attain this first object, the present invention provides a semiconductor device which comprises:

a semiconductor compound substrate on the surface of which there are deposited a source region, a drain region and an intervening channel region;

a source electrode formed on said source region;

a drain electrode formed on said drain region; and a 3-ply gate electrode provided on said channel region, said gate electrode consisting of a high melting metal layer, a barrier metal layer and a gold layer in that order.

The compound semiconductor substrate used in the present invention is prepared from GaAs.

The high melting metal layer is prepared from for example, TiW, or WSi. The barrier metal layer is prepared from, for example, Mo, W.

It is preferred that the high melting metal layer be prepared with a thickness ranging between 50 Å and 1,000 Å; the barrier metal layer be prepared with a thickness ranging between 200 Å and 1,000 Å; and the Au layer be prepared with a thickness ranging between 2,000 Å and 6,000 Å.

The gate electrode of the semiconductor device of this invention is prepared from a high melting metal. Consequently, the source and drain regions can be very precisely formed in self-alignment, with the gate electrode used as a mask, thereby ensuring the manufacture of a semiconductor device free from property variations. The gate electrode provided with a gold layer of low resistivity can be reduced in resistivity as a whole, thus making it possible to produce a field effect transistor adapted for use in high frequency applications. Since a barrier metal layer is interposed between the high melting metal layer and the gold layer, the unwanted penetration of gold through the high melting metal layer into the substrate, which might otherwise arise during annealing for the activation of ion implanted regions, resulting in reaction between the gold and the substrate, and giving rise to the destruction of the Shottky contact, is eliminated.

Another embodiment of this invention provides a method of manufacturing a semiconductor device which comprises the steps of:

forming a high melting metal layer, a barrier metal layer and a gold layer on an active layer formed on a compound semiconductor substrate in the order mentioned;

patterning said gold layer, barrier metal layer and high melting layer in the same pattern, thus forming a 3-ply gate electrode;

mounting an insulating film over the entire surface of said substrate including the surface of said gate electrode;

ion-implanting, in said substrate, an impurity of the same conductivity type as said active layer using as a mask said gate electrode and the insulating film formed on the side wall of said gate electrode;

annealing said substrate to form source and drain regions; and mounting a source electrode on said source region, and a drain electrode on said drain region.

The insulating film used in the present invention can be prepared from, for example, CVD-SiO$_2$. It is possible to subject the insulating film to anisotropic etching prior to the ion implantation step to retain the insulating film on only the side wall of said gate electrode.

It is preferred that annealing for the activation of the ion-implanted region be carried out after forming an out-diffusion-preventing film, for example, PSG film over the entire surface of said ion-implanted region. The deposition of the source and drain electrodes can be effected, for example, by the lift-off method.

As described above, with the method of this invention, since an impurity is implanted in the substrate to provide the source and drain regions by applying a mask consisting of the gate electrode and the insulating film deposited on the side wall of said gate electrode, the source and drain regions can be formed with high precision. Since the gate electrode is a 3-ply type consisting of a high melting metal layer, a barrier metal layer and a gold layer, the gold is prevented from penetrating through the high melting metal layer into the substrate during annealing, and the resistance of the gate electrode is reduced. Further, infrared rapid thermal annealing (IRTA) ensures the full activation of an impurity without a harmful affect on the gate electrode.

DETAILED DESCRIPTION OF THE PREFERRED EMBODIMENT

Figure 1:
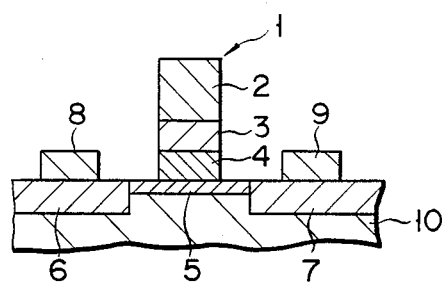
FIG. 1 is a sectional view of a metal semiconductor field effect transistor embodying this invention.

Description may now be made, with reference to the accompanying drawings, of a metal semiconductor field effect transistor embodying this invention. The gate electrode 1 is a 3-ply type consisting of a gold layer 2, an Mo layer 3 acting as a barrier metal layer, and a TiW layer 4 functioning as a high melting metal layer. Said gate electrode 1 is mounted on an N type channel region 5 formed on the surface of a GaAs substrate 10. Provided on both sides of said channel region 5 are a source region 6 and a drain region 7, both of N+ type. A source electrode 8 and a drain electrode 9 are mounted on the corresponding source region 6 and drain region 7.

Figure 2A:
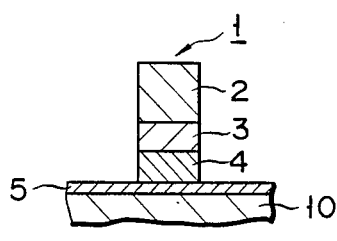
FIGS. 2A to 2F are sectional views indicating the sequential steps of manufacturing the field effect transistor of FIG. 1.
Figure 2D:
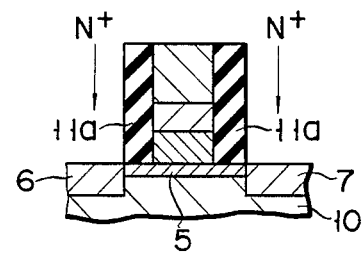
Figure 2B:
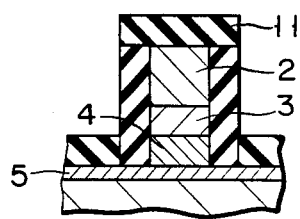
Figure 2E:
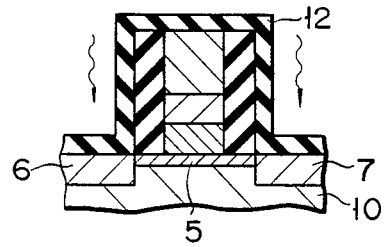
Figure 2C:
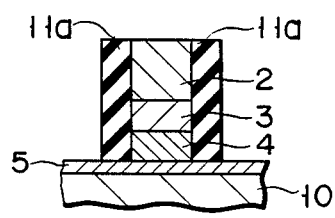
Figure 2F:
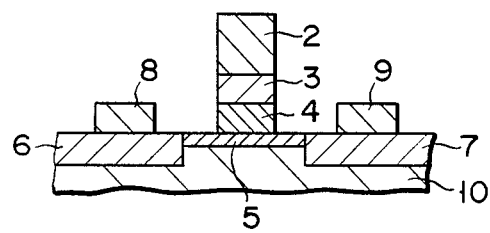

Description may now be made, with reference to FIGS. 2A to 2F, of the sequential steps of manufacturing the subject metal semiconductor field effect transistor.

A TiW layer 4 (thickness, 1,000 Å) acting as a high melting metal layer, an Mo layer 3 (thickness, 1,000 Å) functioning as a barrier metal, and a gold layer 2 (thickness 5,000 Å) is formed on an N type active layer 5 to be used as a channel region which is formed on a GaAs substrate 10. The above-mentioned metal layers are selectively removed by means of anisotropic etching, for example, reactive ion etching (RIE), to form a gate electrode 1 on said N type active layer (channel region) 5. Then (FIG. 2B) a SiO$_2$ film 11 is provided with a thickness of 0.5 microns by means of plasma CVD over the entire surface of said gate electrode 1 and GaAs substrate 10. Next (FIG. 2C), an anisotropic etching, for example, RIE is applied to said SiO$_2$ film 11, thereby causing an SiO$_2$ film 11a to be retained on both side walls of said gate electrode 1. Thereafter (FIG. 2D), an N type impurity, for example, $_{29}$Si is ion-implanted in the substrate 10 with the gate electrode 1 and SiO$_2$ film 11a used as masks to produce N+ type regions 6 and 7. Thereafter (FIG. 2E) a cap film 12 consisting of phosphosilicate glass (PSG) is formed over the entire surface of the structure to suppress out-diffusion. Later, annealing is applied by means of infrared ray irradiation for several to 10 seconds at a temperature of 700° to 1,000° C. to activate said N+ type regions, thereby providing source and drain regions 6 and 7. Last (FIG. 2F), those portions of said PSG film which are formed in the prescribed section of said source region 6 and drain region 7 are selectively removed. Then an Au-Ge layer is mounted on the whole surface of the remaining mass. The PSG film 12 is etched off and the overlying Au-Ge layer is lifted off to provide the source electrode 8 and drain electrode 9, thus finishing the subject metal semiconductor field effect transistor.

Referring to the above-mentioned process of manufacturing the semiconductor device, the anisotropic etching of the SiO$_2$ film 11 is not always required. It is possible to shift from the step of FIG. 2B in which the SiO$_2$ film 11 is formed on the entire surface of the fabricated structure, to the step of FIG. 2D in which the N type impurity is ion implanted. In such a case, the SiO$_2$ film 11 has to be removed in the succeeding step. The thickness of the SiO$_2$ film 11 is controlled so as to prevent overlapping between the gate electrode 1 and a region defined between the source and drain regions 6 and 7, to isolate said gate electrode 1 from said intervening region. The SiO$_2$ film 11a retained on both side walls of the gate electrode 1 may eventually be removed or left in situ.

We claim:

1. A semiconductor device comprising:
   a compound semiconductor substrate whose surface is provided with a source region, a drain region and an intervening channel region;
   a source electrode formed on said source region;
   a drain electrode formed on said drain region; and
   a 3-ply gate electrode mounted on said channel region and consisting of a high melting metal layer, a barrier metal layer and a gold layer, respectively, said high melting metal layer being TiW, and said barrier metal being Mo.

2. The semiconductor device according to claim 1, wherein said compound substrate is prepared from GaAs.

3. The semiconductor device according to claim 1, wherein said high melting metal forms a Shottky contact with said compound semiconductor.

4. The semiconductor device according to claim 1, wherein said channel region is an N type impurity region, and said source and drain regions are N+ type impurity regions.

5. The semiconductor device according to claim 1, wherein said source and drain electrodes are prepared from an Au-Ge alloy.

* * * * *